(12) United States Patent
Hu (10) Patent No.: US 9,166,478 B2
(45) Date of Patent: Oct. 20, 2015

(54) POWER SUPPLY DEVICE, METHOD FOR MANAGING POWER SUPPLY THEREOF AND WIRELESS COMMUNICATION TERMINAL

(75) Inventor: Dongping Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 14/371,830

(22) PCT Filed: Apr. 5, 2012

(86) PCT No.: PCT/CN2012/073510
§ 371 (c)(1),
(2), (4) Date: Jul. 11, 2014

(87) PCT Pub. No.: WO2013/104149
PCT Pub. Date: Jul. 18, 2013

(65) Prior Publication Data
US 2014/0355715 A1    Dec. 4, 2014

(30) Foreign Application Priority Data

Jan. 12, 2012   (CN) .......................... 2012 1 0009131

(51) Int. Cl.
*H04L 25/03* (2006.01)
*H02M 3/157* (2006.01)
(Continued)

(52) U.S. Cl.
CPC ............. *H02M 3/157* (2013.01); *H03F 1/0227* (2013.01); *H03F 3/19* (2013.01); *H03F 3/21* (2013.01);
(Continued)

(58) Field of Classification Search
CPC ................ H03F 1/0222; H03F 1/0223; H03F 2200/102; H03F 2200/451; H03F 2201/3227; H03F 1/0233; H03F 1/0255; H03F 1/0238; H03G 3/004; H03G 3/007; H03G 2201/206; H04B 2001/0416; H04B 2001/045
See application file for complete search history.

(56) References Cited

U.S. PATENT DOCUMENTS 5,809,432 A * 9/1998 Yamashita ................. 455/575.1
6,141,541 A * 10/2000 Midya et al. .................... 455/91
(Continued)

FOREIGN PATENT DOCUMENTS

| CN | 102075149 A | 5/2011 |
|---|---|---|
| CN | 102148563 A | 8/2011 |

(Continued)

OTHER PUBLICATIONS

English-language abstract of Chinese Patent No. CN 102075149 A, European Patent Office, May 25, 2011.
(Continued)

*Primary Examiner* — Sophia Vlahos
(74) *Attorney, Agent, or Firm* — DASCENZO Intellectual Property Law, P.C.

(57) ABSTRACT

In the patent document, the wireless communication terminal includes a baseband working unit, a RF working unit and a DC power converter connected with the baseband working unit and the RF working unit, further including a power supply device, a CPU and an envelope detection device; the power supply device is configured to receive a voltage supplied by the DC power converter, supplying an output voltage to a PA in the RF working unit, receiving a control signal sent from CPU, adjusting the output voltage according to the control signal; the envelope detection device is configured to detect the envelope signal of output signal of the PA in real time and send the envelope signal to the CPU; the CPU is configured to receive the voltage supplied by the DC power converter, convert the envelope signal into a control signal and send the control signal to the power supply device.

12 Claims, 4 Drawing Sheets

(51) Int. Cl.
  *H04B 1/16*   (2006.01)
  *H03F 1/02*   (2006.01)
  *H03F 3/24*   (2006.01)
  *H03F 3/19*   (2006.01)
  *H03F 3/21*   (2006.01)
  *H04B 1/04*   (2006.01)
  *H03G 3/00*   (2006.01)

(52) U.S. Cl.
  CPC .............. *H03F 3/245* (2013.01); *H04B 1/1607* (2013.01); *H03F 2200/102* (2013.01); *H03F 2200/451* (2013.01); *H03G 3/004* (2013.01); *H04B 2001/045* (2013.01)

(56) References Cited

U.S. PATENT DOCUMENTS

| | | | |
|---|---|---|---|
| 7,276,966 | B1 | 10/2007 | Tham et al. |
| 7,372,333 | B2 * | 5/2008 | Abedinpour et al. ......... 330/297 |
| 7,446,514 | B1 * | 11/2008 | Li et al. ......... 323/280 |
| 8,406,706 | B2 * | 3/2013 | Heo et al. ......... 455/108 |
| 2003/0034839 | A1 | 2/2003 | Poggi et al. |
| 2003/0107440 | A1 | 6/2003 | Miki et al. |
| 2008/0003962 | A1 | 1/2008 | Ngai |
| 2008/0094768 | A1 * | 4/2008 | Perra et al. ......... 361/79 |
| 2010/0066433 | A1 | 3/2010 | Mochizuki |
| 2011/0279179 | A1 | 11/2011 | Vice |

FOREIGN PATENT DOCUMENTS

| | | |
|---|---|---|
| CN | 102196336 A | 9/2011 |
| CN | 102299567 A | 12/2011 |
| WO | WO 03/065599 A1 | 8/2003 |
| WO | WO 2004/070941 A2 | 8/2004 |
| WO | WO 2009/059459 A1 | 5/2009 |

OTHER PUBLICATIONS

English-language abstract of Chinese Patent No. CN 102148563 A, European Patent Office, Aug. 10, 2011.
English-language abstract of Chinese Patent No. CN 102196336 A, European Patent Office, Sep. 21, 2011.
English-language abstract of Chinese Patent No. CN 102299567 A, European Patent Office, Dec. 28, 2011.

* cited by examiner

POWER SUPPLY DEVICE, METHOD FOR MANAGING POWER SUPPLY THEREOF AND WIRELESS COMMUNICATION TERMINAL

TECHNICAL FIELD

The patent document relates to the field of power supply management, and more particularly, to a power supply device, a method for managing power supply thereof, and a wireless communication terminal.

BACKGROUND OF THE INVENTION

Figure 1A:
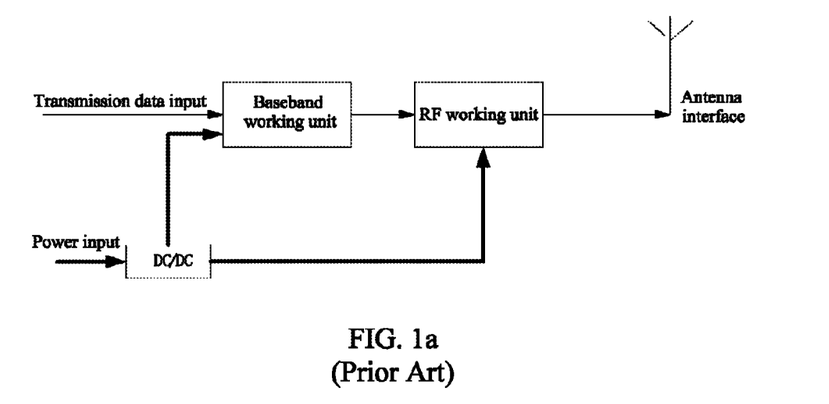
FIG. 1a is a diagram of the architecture of a traditional data card and its mode of power supply.

A power conversion module is the core part of data card products and plays a decisive role in the price-performance ratio of the data card products. Continuous power technology innovation and individual needs of the power technology have long been the objectives focused and pursued by product research and development engineers. The traditional data card, the method for supplying power to the data cards, and the method for managing the power supply are shown in FIG. 1a, and its main characteristics are embodied in the following aspects:

the data card mainly comprises a baseband working unit and a radio frequency (RF) working unit, the power supply of the above-mentioned two working units is provided by an external input power supply of the data card outputting an appropriate power to supply power for the baseband and RF working units through a single-chip DC power converter.

The above-mentioned data card and its method for supplying power have advantages of simple structure and low cost, but meanwhile they have the following problems:

1. The output power of the power supply of the conventional data card cannot dynamically adapt to the change of load and cannot automatically adjust the output power of the power supply device in real time, especially when supplying power to the power amplifier (hereinafter referred to as PA) in the RF circuits, the power supply device of the traditional data card and the management method thereof cannot perform the adjustment dynamically with the change of the output load of the amplifier, thus it is difficult to solve the power consumption and heat dissipation problems of the products.

2. In the traditional data products, the communication between the power supply device and the main central processing unit (CPU) mainly adopts the CPU's general-purpose input/output (GPIO) ports for implementation. That is, the CPU needs to use some of the input/output (I/O) ports for the parameter detection of the power supply module, and use the other I/O ports for the control of the power supply module. Obviously, when the detected parameters or control amount increases, the number of I/O ports used by the CPU increases dramatically. The method also increases the complexity of the system, taking up a lot of CPU hardware resources, and meanwhile it also increases the physical space of the circuit board, not suitable for compact design of the terminal products.

3. The conventional data card products often lack the real-time monitoring and centralized management of the CPU for core components such as the power conversion device and the charging management device in the system to enhance the reliability and flexibility of system.

Product research and development engineers want to use a device to monitor and manage the power supply module in real time via the CPU in the system, to solve the above-mentioned problems and enhance the flexibility and reliability of system. However, the existing technical solutions cannot meet the above-mentioned requirements very well.

SUMMARY OF THE INVENTION

The embodiment of the present invention provides a power supply device, a method for managing power supply thereof, and a wireless communication terminal to solve power consumption and heat dissipation problems of power amplifier (PA) in a wireless communication terminal such as a current data card.

The embodiment of the present invention provides a wireless communication terminal, comprising a baseband working unit and a radio frequency (RF) working unit, and a direct current (DC) power converter connected with both said baseband working unit and said RF working unit, and said wireless communication terminal further comprises: a power supply device, a central processing unit (CPU) and an envelope detection device, wherein:

said power supply device is configured to receive a voltage supplied by said DC power converter, provide an output voltage to a power amplifier (PA) in said RF working unit, receive a control signal sent by said CPU, and adjust said output voltage according to said control signal, so that said output voltage meets an envelope variation curve of output signal of said PA;

said envelope detection device is connected with said RF working unit, and it is configured to detect an envelope signal of said output signal of PA in real time, and send said envelope signal to said CPU;

said CPU is connected respectively with said DC power converter, said power supply device and said envelope detection device, and it is configured to: receive a voltage provided by said DC power converter, convert said envelope signal sent by said envelope detection device into a control signal, and send said converted control signal to said power supply device.

Preferably, said CPU is further configured to convert the information inputted via a human-machine interface of said wireless communication terminal into a control signal, and send said converted control signal to said power supply device.

Preferably, said CPU is connected with said power supply device by IIC bus.

Preferably, said power supply device comprises a DC power conversion unit, a power input detection unit, a state monitoring and logic control unit and a power output detection unit, wherein:

said DC power supply conversion unit is configured to receive said voltage input by said DC power converter, provide an output voltage to said PA, receive a logic control signal sent by said state monitoring and logic control unit, and adjust said output voltage in accordance with said logic control signal;

said power input detection unit is configured to detect an input signal of said DC power conversion unit, and send an input detection result to said state monitoring and logic control unit;

said power output detection unit is configured to detect an output signal of said DC power conversion unit, and send an output detection result to said state monitoring and logic control unit;

said state monitoring and logic control unit is configured to receive said control signal sent by said CPU, compare any one of said input detection result sent by said power input detection unit and the output detection result sent by said power output detection unit with said control signal and, if the two are inconsistent, send a logic control signal to said DC power conversion unit.

Preferably, said state monitoring and logic control unit is implemented with a state machine.

The embodiment of the present invention also provides a power supply device comprising a DC power conversion unit, a power input detection unit, a state monitoring and logic control unit and a power output detection unit, wherein:

said DC power supply conversion unit is configured to receive a voltage input by said DC power converter, provide an output voltage to a load, receive a logic control signal sent by said state monitoring and logic control unit, and adjust said output voltage in accordance said logic control signal, so that said output voltage meets needs of said load;

said power input detection unit is configured to detect an input signal of said DC power conversion unit and send the input detection result to said state monitoring and logic control unit;

said power output detection unit is configured to detect an output signal of said DC power conversion device and send the output detection result to said state monitoring and logic control unit;

said state monitoring and logic control unit is configured to receive a control signal sent by a central processing unit (CPU), and compare any one of said input detection result sent by said power input detection unit and the output detection result sent by said power output detection unit with said control signal and, if the two are inconsistent, send a logic control signal to said DC power conversion unit.

Preferably, said state monitoring and logic control unit is implemented with a state machine.

Preferably, said load comprises a radio frequency power amplifier.

The embodiment of the present invention further provides a method for power supply device managing power supply, and said method comprises:

said power management device acquiring expected operating parameters; and said power management device acquiring an output voltage provided to a load in real time, comparing said output voltage with said expected operating parameters, and if the two are consistent, keeping providing said output voltage to said load and, if the two are inconsistent, adjusting said output voltage according to said expected operating parameters, so that said output voltage meets needs of said load.

Preferably, the step of said power management device acquiring said expected operating parameters comprises:

said power management device receiving the expected operating parameters, sent by said central processing unit (CPU), converted according to a signal of load or acquired information of user's needs.

The above-mentioned power supply device, the method for managing power supply thereof and the wireless communication terminal can flexibly communicate with a CPU having strong software and hardware resources, to achieve the real-time power detection and control, to achieve a variety of power management needs, to reduce power consumption of the wireless communication terminals, and to solve the heat dissipation problem of the wireless communication terminals.

PREFERRED EMBODIMENTS OF THE PRESENT INVENTION

To make the objectives, technical solutions and advantages of the patent document more clear, hereinafter the embodiments of the present invention would be described in detail with combination of the accompanying drawings. It should be noted that, in the case of no conflict, the embodiments in the present application and features in the embodiments can be combined arbitrarily with each other.

The embodiment of the present invention provides a wireless communication terminal comprising a baseband working unit, a RF working unit and a DC power converter connected with said baseband working unit and said RF working unit, and said wireless communication terminal further comprises: a power supply device, a central processing unit (CPU) and an envelope detection device, wherein:

said power supply device is located between said DC power converter and said RF working unit, and it is configured to receive a voltage provided by said DC power converter, provide an output voltage to the power amplifier (PA) in said RF working unit, receive a control signal sent by said CPU, and adjust said output voltage according to said control signal, so that said output voltage meets the envelope variation curve of an output signal of said PA;

said envelope detection device is connected with said RF working unit, and it is configured to monitor the envelope signal of said output signal of said PA in real time, and send said envelope signal to said CPU;

said CPU is connected respectively with said DC power converter, said power supply device and said envelope detection device, and it is configured to receive the voltage provided by said DC power converter, convert said envelope signal sent by said envelope detection device into a control signal, and send said control signal to said power supply device.

Wherein, said CPU is further configured to convert the information inputted via the human-machine interface of said card data into said control signal, and send said control signal to said power supply device.

Preferably, said CPU is connected with said power supply device by the IIC (Inter Integrated Circuit) bus.

Figure 1B:
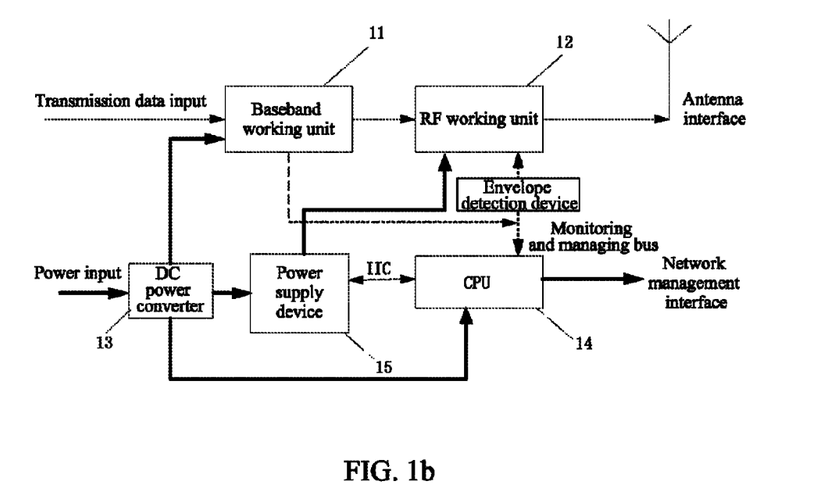
FIG. 1b is an architectural diagram of a data card powered by a power supply device with IIC interface in accordance with the patent document.

The above-mentioned wireless communication terminal can be a data card or other product, and in the following, the data card is taken as an example to describe in detail the technical solutions in accordance with the embodiment of the present invention:

As shown in FIG. 1b, it is an architectural diagram of the data card powered by a power supply device with IIC interface in accordance with the patent document, and said data card comprises: baseband working unit 11, RF working unit 12, DC power converter 13, CPU 14, and power supply device 15 with IIC bus. Wherein, the thin black line indicates the data transmission path of the communications products, the thick black line indicates the power supply path, and the thin dashed line indicates the bus over which said CPU monitors and manages various function modules. The data input end of said baseband working unit is connected to the USB socket through the USB cable, and the output end of said baseband working unit is connected with the input end of said RF working unit, and the output end of said RF working unit is connected with communication transmitting antenna through the antenna interface. The 5V input power of said data card is first sent to said DC power converter, and the converted DC power is sent respectively to said baseband working unit, said CPU, and said power supply device with IIC bus. Wherein, the power supply device with TIC bus supplies power to the power amplifier (hereinafter referred to as PA) in said RF working unit. The primary CPU establishes a communication with said power supply device over the IIC bus, connects with said RF working unit and said baseband working unit by a monitoring and managing bus, and monitors and manages the operating state of said RF working unit and said baseband working unit.

Figure 2:
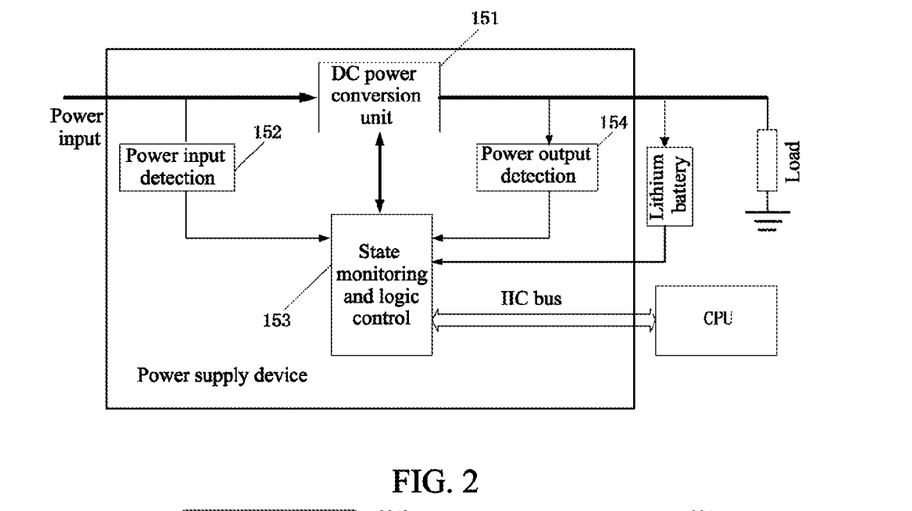
FIG. 2 is an architectural schematic diagram of a power supply device with IIC interface in accordance with the patent document.

Said power supply device with IIC bus in the above-mentioned data card specifically comprises: DC power conversion unit 151, power input detection unit 152, state monitoring and logic control unit 153 and power output detection unit 154, as shown in FIG. 2, wherein:

the input end of the above-mentioned DC power conversion unit is connected with the power supply, and its output end is connected with the power supply load, implementing converting the input power into an output power that meets the needs of the load; the unit further comprises a controlled input interface, and it is configured to receive the logic control signal sent by said state monitoring and logic control unit; specifically, it is configured to receive the voltage input by said DC power converter, provide the output voltage to said PA, receive the logic control signal sent by the state monitoring and logic control unit, and adjust the output voltage of said DC power conversion unit according to said logic control signal;

the input end of the above-mentioned power input detection unit is connected with the input end of said DC power conversion unit, and its output end is connected with said state monitoring and logic control unit, and it is configured to perform detection on the input signal of said DC power conversion unit, and send the input detection result to said state monitoring and logic control unit;

the input end of the above-mentioned power output detection device is connected with the output end of said DC power conversion unit, and its output end is connected with said state monitoring and logic control unit, and it is configured to perform detection on the output signal of said DC power conversion unit and send the output detection result to said state monitoring and logic control unit;

the input end of the above-mentioned state monitoring and logic control unit is respectively connected with said power input detection unit and said power output detection unit, and its output end is connected with said DC power conversion unit, and it is configured to store the detection results of said power input detection unit and said power output detection unit; compare any one of said input detection result sent by said power input detection unit and the output detection result sent by said power output detection unit with said control signal and, if the two are inconsistent, send a logic control signal to said DC power conversion unit, to achieve functions such as the state control of said DC power conversion unit.

The process of said data card managing the power supply is as follows:

said power supply device supplies power to the PA in said RF working unit, and said CPU detects the envelope of the output signal of the PA in real time by the monitoring and managing bus, and converts the envelope signal into a control signal by using the CPU software algorithms, and transmits said control signal to said power supply device with the IIC bus interface over the IIC bus, so that the amplitude of the output voltage of the power supply device with IIC bus interface follows the change in the envelope curve of the output signal of the PA, which can improve the working efficiency of the PA and reduce power consumption and heat dissipation of the PA in the data card.

The above-mentioned power supply device with IIC bus interface supplies power to the data card, and a combination of hardware and software can be used to realize the real-time dynamic interaction between the power supply and the load as well as between the power supply and the product end-users, thereby solving the problems of power consumption and heat dissipation of the products. In addition, the IIC bus interface can be used to achieve the communication between the CPU and the power supply device, therefore, detecting and controlling I/O ports can be multiplexed, that is, only two I/O ports are required, and the number of I/O ports does not increase with the increase of the detection or control amount, which overcomes the defects well in the related art that the mode of managing the power supply mostly adopts hardware configuration and it is not flexible enough.

Furthermore, the embodiment of the present invention also provides a power supply device, and the structure of said power supply device is the same as that of the power supply device in the above-mentioned data card, and as shown in FIG. 2, it is not mentioned here; it should be noted that the PA in the RF working unit in FIG. 1 is one example of the load in FIG. 2, and the person skilled in the art knows that said load can be replaced with another equipment or apparatus.

The embodiment of the present invention further provides a method for a power supply device managing the power supply, and said method comprises:

step one, said power management device achieves the expected operating parameters;

step two, said power management unit acquires the output voltage provided to the load in real time, comparing said output voltage with said expected operating parameters, and if the two are consistent, said output voltage is continued to be provided to said load and, if the two are inconsistent, said output voltage is adjusted according to the expected operating parameters, so that said output voltage meets the needs of the load.

Figure 3:
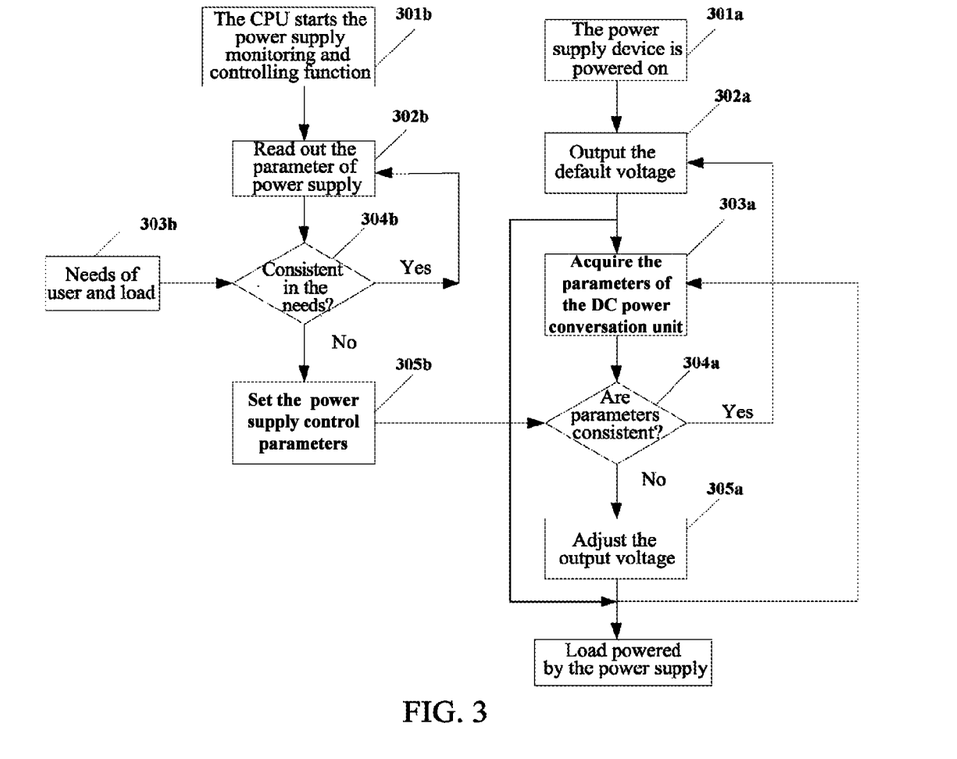
FIG. 3 is a flow chart of the power supply device with IIC interface managing the power supply in accordance with the patent document.

As shown in FIG. 3, it is a flow chart of the power supply device with IIC interface managing the power supply in accordance with the patent document, and without special instructions, the left side of the figure can be understood as a flow chart of the CPU controlling and managing said power supply device with IIC interface, and it is mainly implemented by the CPU software (corresponding to the abovementioned step one), and the right side of the figure can be understood as the operating process of the power supply device with IIC interface, and the process of interacting with external information (including the user's manual settings, load parameters and so on), and it is achieved by using the hardware circuit of the power supply device with IIC interface (corresponding to the abovementioned step two).

The operating process of the power supply device with IIC interface is as follows:

Step 301a, the power supply device is initially powered on;

step 302a, with the hardware circuit settings, the default transient output of the power supply is configured as 3.6V-4.2V.

After said power supply device is powered on, the power supply works at the initial default state and outputs the default voltage and current parameters; the parameter register within said power supply device enters into the reset state and clears the values in the register; the embedded IIC bus interface and the initialized IIC bus are ready to communicate with the primary CPU implementing the power management.

step 303a, the power input/output parameter detection unit sends the real-time collected parameters to the state and parameter registers, providing them to the primary CPU for inquiry in real-time, and the primary CPU implementing power management reads the parameters in the state and parameter registers via the IIC bus and acquires the operating state of the power supply;

step 304a, the state monitoring and logic control unit (implemented with a state machine) in the power supply unit with IIC interface accepts the control parameters transferred by said CPU over the IIC bus, and by comparing the control parameters transferred by the CPU with the state parameters of the DC/DC DC conversion unit detected by the power supply device itself and judging whether the two are consistent or not, it is determined whether it needs to adjust accordingly the output parameters of said DC/DC DC conversion unit or not, so as to adapt to the dynamic change of the load and the user parameter settings, if no, proceeding to step 302a and the DC power is output and supplied to the load according to the default method, otherwise, proceeding to step 305a, meanwhile, continuing to acquire the state parameters of said DC conversion unit;

step 305a, in accordance with the requirements of the CPU control parameters or the parameters manually set by the user, the DC power is output and supplied to said load.

In the data card including the above-mentioned power supply device, it needs the CPU to implement the function of power management by means of software. Wherein, communication is established between the CPU and the power supply device through the IIC bus. Said CPU achieves power management for said power supply device with IIC bus interface by means of software, and its process is as follows:

step 301b, said CPU starts said power management module;

step 302b, said CPU power management module initializes said IIC bus, establishing a communication with said power supply device with IIC bus interface, and it reads the parameter of the operating state of the power supply through the IIC bus;

step 303b, said CPU can accept the information of the power supply user's needs, for example, said power supply is in the state of charging the battery, the user can set parameters such as charging current and charging time via the human-machine interface in said data card in accordance with the patent document; or it accepts the changing dynamic information of the load powered by power supply, and the information primarily comprises the power consumption curve of the load, the required current or voltage curve and so on;

step 304b, said CPU performs the comprehensive judgment according to the information of the operating state of the power supply, the power supply user's needs and the change of the load powered by the power supply and so on, and it is determined whether it needs to adjust the power supply output parameters or not and, if it does not need to perform the adjustment, returning to step 302b, otherwise, proceeding to step 305b;

step 305b, the CPU outputs the power supply control parameters, and sends them to the power supply device with IIC bus interface over the IIC bus, to make the output power meet the requirements.

Wherein, two 6 bit registers R [7:2] are used to store the adjustment difference and detection parameters of the amplitude of the output voltage. The minimum output voltage of the power supply is 3.5V, and the maximum output voltage 4.44V. That is, the maximum value 4.44V corresponds to the HEX number "62"; and 3.5V corresponds to the HEX number "00". Each minimum logic state of the registers corresponds to the minimum value, 0.02V, of the output voltage of said power supply, that is, the minimum resolution of the output voltage adjustment is 0.02V. Therefore, a corresponding data table (hereinafter referred to as the output voltage mapping table) is provided in the CPU to perform mapping for a group of register values and output voltage values, and the corresponding relationship is as described above, and the CPU acquires the register setting values corresponding to the output voltage of the power supply by looking up the table, or it acquires the actual output voltage value of the power supply by reading the parameter register value in the power converter and looking up the table.

Figure 4:
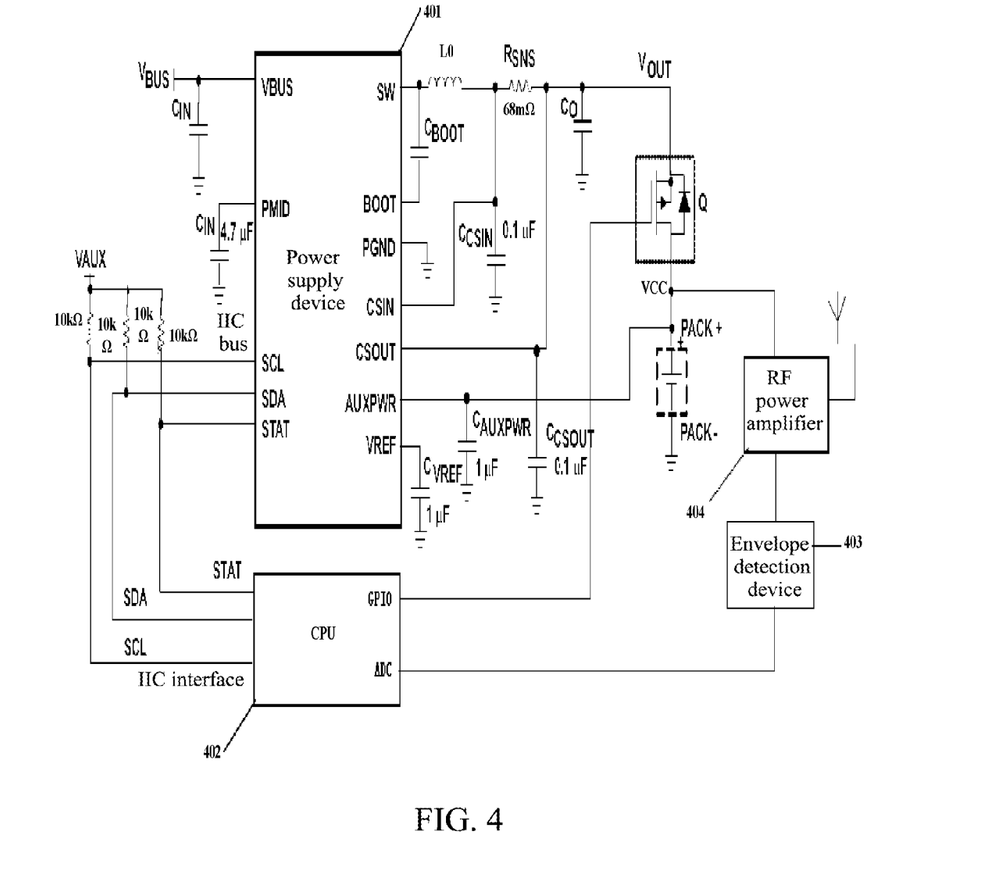
FIG. 4 is a specific embodiment of data card power management of the power supply device with IIC interface in accordance with the patent document.

To further illustrate the structure of the power supply device and the data card including the power supply device in accordance with the patent document, a specific embodiment will be described in the following for illustration, as shown in FIG. 4:

in this embodiment, the 5V power inputted through the USB bus interface (hereinafter referred to as VBUS) is sent to the power supply device with IIC bus 401, and the output voltage (3.5V-4.4V) converted by the power supply device is output to one end of the energy-storage inductor (L0) through the output end (the SW) of said DC power conversion unit, and the other end of L0 is connected with one end of the $R_{SNS}$, and the other end of $R_{SNS}$ is connected with the drain of the switch tube Q, and the source of the switch tube Q is connected with the power supply end of the load PA (hereinafter referred to as VCC), and meanwhile, it can also be connected to a battery with the charging function for charging. The gate of the switch tube Q is connected to the GPIO of the CPU 402 in the system. Said CPU can implement the power supply on/off function on the PA and the rechargeable battery via the GPIO. Said $R_{SNS}$ is the power supply output current parameter detection apparatus, converting the output current into a voltage and sending the voltage to said power converter for output parameter detection; the IIC interface serial clock (SCL) and serial data (SDA) of the power converter are connected to the general GPIO pin or the IIC bus interface of the CPU in the system; the charging state indication signal (STAT) of the power converter is connected to another GPIO port of the CPU in the system, which is used to monitor the state of the power converter charging the battery load, and said power converter is in the charging state, and the signal outputs logic high level, and after the charging finishes, the signal outputs logic low level. The input end of the envelope detection device 403 is connected to the output end of the RF power amplifier (hereinafter referred to as PA) 404, and the output end of said envelope detection device is connected to the input end of the high-speed analog-to-digital converter (ADC) of the CPU in the system.

Figure 5:
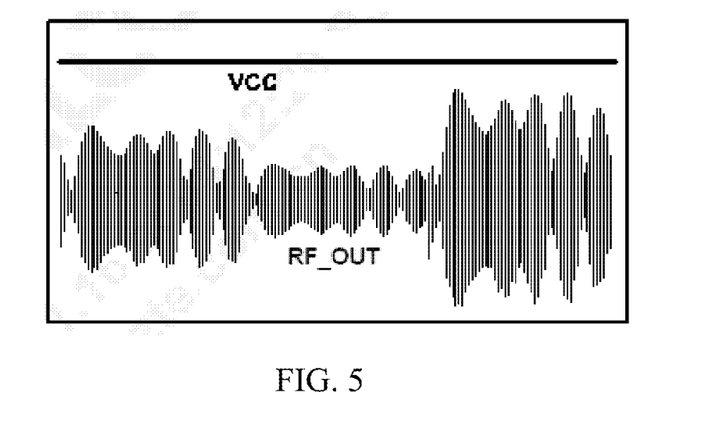
FIG. 5 is a schematic diagram of the working power supply VCC of the PA in a traditional RF working unit.

According to the traditional power management design project: the current absorbed by the PA from the power supply during operation remains substantially constant, even if the VCC voltage changes; if the PA outputs a higher level signal, the PA must also provide a higher VCC voltage in order to maintain the linearity; if the supply voltage VCC of PA remains unchanged, the PA is required to have sufficient linearity, so that the maximum power level output by the PA can meet the requirements of the system, and the distortion will not be produced in the signal power amplification and so on. Therefore, it raises relatively high requirements for the PA itself. However, in order to maintain the linearity of the PA on the premise that the breakthrough improvement does not exist in the performance of the existing PA itself, the power supply is bound to provide relatively high voltage VCC, as shown in FIG. 5, while the current required by the PA remains unchanged. The efficiency curve of the PA in this design represents that, when the output power level of the PA is higher, the efficiency of the PA is higher, while when the output power level of the PA is lower, the lower the efficiency of the PA is (it requires said VCC to have the higher voltage). This is extremely unfavorable to the power consumption and heat dissipation of the products.

Figure 6:
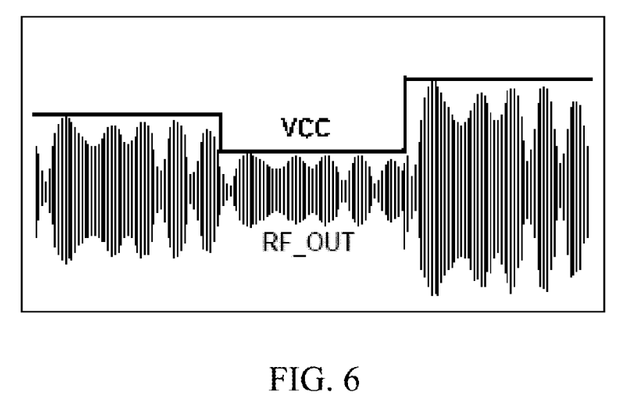
FIG. 6 is a schematic diagram of the PA's power supply VCC managed by the data card power supply of the power supply unit with IIC interface in accordance with the patent document.
Figure 7:
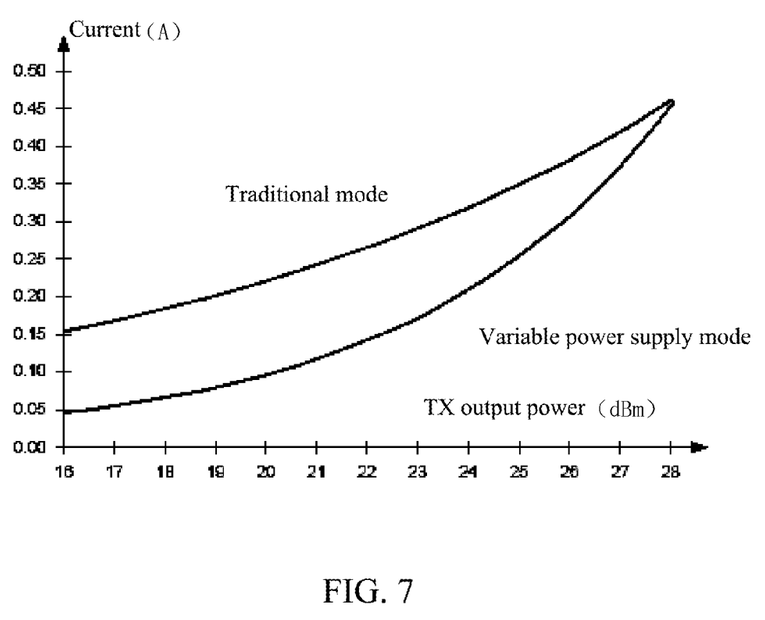
FIG. 7 is a diagram of comparing the traditional mode of power supply with the current curve of the data card PA power supply in the device in accordance with the patent document.

As shown in FIG. 4, the VCC of the PA is connected to the power supply device with IIC bus interface, and the power supply of the PA establishes a communication with the primary CPU, and it is controlled by the CPU in real time, and the envelope detection device samples the output signal of the PA in the RF working unit, and performs the amplitude detection on the sampled signal. The detection of the envelope detection device outputs the envelope signal to the ADC interface of the CPU, and the ADC interface performs the high-speed sampling and A/D conversion on the detection signal, that is, the digital processing is performed on the envelope signal, and the A/D digitized bite data is stored in the memory of the CPU, and said CPU compares the digitized bite data converted from the envelope signal with the data in the above-mentioned output voltage mapping table in real time, that is, it needs to search out the data equal to or slightly greater than its own data. Then, the CPU writes said data in the voltage mapping table into the power supply device by the IIC bus, such that the output voltage of said power supply device is adjusted with the amplitude of the output signal of the PA. The waveform of the power supply VCC shown in FIG. 4 is shown in FIG. 6. Therefore, the output voltage of the power supply device can be automatically adjusted in real time with the amplitude of the output signal of the PA. This can improve the efficiency of conversion between the power supply of the PA shown in FIG. 4, that is, the power supply device with IIC bus, and the PA output in the RF working unit, thereby reducing the PA's own power consumption and heat dissipation, and also extending the service life of the power supply device.

In short, the power supply device with IIC bus can flexibly communicate with the CPU having powerful software and hardware resources, to achieve the real-time detection and control of the power supply, and to achieve a variety of power management requirements, and it can reduce the power consumption of the data card and solve the heat dissipation problem of wireless communication terminals such as data cards in a relatively good way.

Those ordinarily skilled in the art can understand that all or some of steps in the above-mentioned method may be completed by programs instructing the relevant hardware, and said programs may be stored in a computer-readable storage medium, such as read only memory, magnetic or optical disk. Optionally, all or some of the steps in the above-mentioned embodiments may also be implemented by using one or more integrated circuits. Accordingly, each module/unit in the above-mentioned embodiment may be realized in the form of hardware or software function modules. The patent document is not limited to any specific form of hardware and software combinations.

The above embodiments are only used to illustrate rather than used to restrict the technical solutions of the patent document, and the patent document is only described in detail with reference to the preferred embodiments. Those ordinarily skilled in the art should understand that modifications and equivalent replacements can be made for the technical solutions of the patent document without departing from the spirit and scope of the technical solutions of the patent document, and these modifications and equivalent replacements should be included in the scope of the claims of the patent document.

INDUSTRIAL APPLICABILITY

The above-mentioned power supply device, the method for managing power supply thereof and the wireless communication terminal can flexibly communicate with a CPU having strong software and hardware resources, to achieve the real-time detection and control of the power supply, to achieve a variety of power management requirements, to reduce power consumption of the wireless communication terminals, and to solve the heat dissipation problem of the wireless communication terminals in a relatively good way.

What I claims is:

1. A wireless communication terminal, comprising a baseband working unit and a radio frequency (RF) working unit, and a direct current (DC) power converter connected with both said baseband working unit and said RF working unit, said wireless communication terminal further comprising: a power supply device, a central processing unit (CPU) and an envelope detection device, wherein:

said power supply device is configured to receive a voltage supplied by said DC power converter, provide an output voltage to a power amplifier (PA) in said RF working unit, receive a control signal sent by said CPU, and adjust said output voltage according to said control signal, so that said output voltage meets an envelope variation curve of an output signal of said PA;

said envelope detection device is connected with said RF working unit and is configured to detect an envelope signal of the output signal of said PA in real time, and send said envelope signal to said CPU;

said CPU is connected respectively with said DC power converter, said power supply device and said envelope detection device, and the CPU is configured to: receive a voltage provided by said DC power converter, convert said envelope signal sent by said envelope detection device into the control signal, and send the control signal to said power supply device.

2. The wireless communication terminal of claim 1, wherein:
said CPU is further configured to convert information inputted via a human-machine interface of said wireless communication terminal into a control signal, and send the converted control signal to said power supply device.

3. The wireless communication terminal of claim 1, wherein:
said CPU is connected with said power supply device by Inter Integrated Circuit (IIC) bus.

4. The wireless communication terminal of claim 3, wherein:
said power supply device comprises a DC power conversion unit, a power input detection unit, a state monitoring and logic control unit and a power output detection unit, wherein:
said DC power conversion unit is configured to receive the voltage supplied by said DC power converter, provide the output voltage to said PA, receive a logic control signal sent by said state monitoring and logic control unit, and adjust said output voltage in accordance with said logic control signal;
said power input detection unit is configured to perform detection on an input signal of said DC power conversion unit, and send an input detection result to said state monitoring and logic control unit;
said power output detection unit is configured to perform detection on an output signal of said DC power conversion unit, and send an output detection result to said state monitoring and logic control unit;
said state monitoring and logic control unit is configured to receive the control signal sent by said CPU, compare any one of said input detection result sent by said power input detection unit and the output detection result sent by said power output detection unit with said control signal and, if the two compared quantities are inconsistent, send the logic control signal to said DC power conversion unit.

5. The wireless communication terminal of claim 4, wherein:
said state monitoring and logic control unit is implemented with a state machine.

6. A power supply device, comprising a direct current (DC) power conversion unit, a power input detection unit, a state monitoring and logic control unit and a power output detection unit, wherein:
said DC power conversion unit is configured to receive a voltage input by a DC power converter, provide an output voltage to a load, receive a logic control signal sent by said state monitoring and logic control unit, and adjust said output voltage in accordance with said logic control signal, so that said output voltage meets needs of said load;
said power input detection unit is configured to perform detection on an input signal of said DC power conversion unit and send an input detection result to said state monitoring and logic control unit;
said power output detection unit is configured to perform detection on an output signal of said DC power conversion unit and send an output detection result to said state monitoring and logic control unit;
said state monitoring and logic control unit is configured to receive a control signal sent by a central processing unit (CPU), and compare any one of said input detection result sent by said power input detection unit and the output detection result sent by said power output detection unit with said control signal and, if the two compared quantities are inconsistent, send the logic control signal to said DC power conversion unit; wherein at least one of the units is implemented using hardware.

7. The power supply device of claim 6, wherein:
said state monitoring and logic control unit is implemented with a state machine.

8. The power supply device of claim 6, wherein:
said load comprises a radio frequency power amplifier.

9. The wireless communication terminal of claim 2, wherein:
said CPU is connected with said power supply device by Inter Integrated Circuit (IIC) bus.

10. The wireless communication terminal of claim 9, wherein:
said power supply device comprises a DC power conversion unit, a power input detection unit, a state monitoring and logic control unit and a power output detection unit, wherein:
said DC power conversion unit is configured to receive the voltage supplied by said DC power converter, provide the output voltage to said PA, receive a logic control signal sent by said state monitoring and logic control unit, and adjust said output voltage in accordance with said logic control signal;
said power input detection unit is configured to perform detection on an input signal of said DC power conversion unit, and send an input detection result to said state monitoring and logic control unit;
said power output detection unit is configured to perform detection on an output signal of said DC power conversion unit, and send an output detection result to said state monitoring and logic control unit;
said state monitoring and logic control unit is configured to receive the control signal sent by said CPU, compare any one of said input detection result sent by said power input detection unit and the output detection result sent by said power output detection unit with said control signal and, if the two compared quantities are inconsistent, send the logic control signal to said DC power conversion unit.

11. The wireless communication terminal of claim 10, wherein:
said state monitoring and logic control unit is implemented with a state machine.

12. The power supply device of claim 7, wherein:
said load comprises a radio frequency power amplifier.

* * * * *